United States Patent

Minegishi et al.

[11] Patent Number: 6,015,720
[45] Date of Patent: *Jan. 18, 2000

[54] METHOD OF FORMING POLYCRYSTALLINE SEMICONDUCTOR THIN FILM

[75] Inventors: Masahiro Minegishi; Masumitsu Ino; Masafumi Kunii; Takenobu Urazono; Hisao Hayashi, all of Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/544,569

[22] Filed: Oct. 18, 1995

[30] Foreign Application Priority Data

Oct. 19, 1994 [JP] Japan .................................. 6-280097

[51] Int. Cl.$^7$ ............................................... H11L 21/268
[52] U.S. Cl. .......................... 438/30; 438/166; 438/487
[58] Field of Search .................................... 437/799, 173, 437/233, 101, 109, 40 TTF, 41 TTF, 181, 51; 257/72; 117/8, 904; 359/59, 87; 438/30, 166, 479, 482, 488, 487

[56] References Cited

U.S. PATENT DOCUMENTS 4,309,224 1/1992 Shibata ..................................... 438/679
4,409,724 10/1983 Tasch, Jr. et al. ......................... 438/30

(List continued on next page.)

FOREIGN PATENT DOCUMENTS 0 681 316 A2 11/1995 European Pat. Off. ..

OTHER PUBLICATIONS

Troxell, John R., et al., "Laser–Recrystallized Silicon Thin–Film Transistors on Expansion–Matched 800AC Glass", *I.E.E.E. Electron Device Letters,* vol. EDL–8, No. 12, pp. 576–578, Dec. 1, 1987.

Tsai, M.J., et al., "Grain Growth of Laser–Recrystallized Polycrystalline and Amorphous Silicon Films", *Thin Solid Films,* vol. 249, No. 2, pp. 224–229, Sep. 15, 1994, Lausanne, CH.

Sameshima, T, "Self Organized Grain Growth Larger Than $\mu$m Through Pulsed–Laser–Induced Melting of Silicon Films", *Japanese Journal of Applied Physics,* vol. 32, No. 108, pp. L 1485–1488, Oct. 15, 1993.

Kimura, Masakazu, et al., "Influence of AS–Deposited Film Structure on (100) Texture in Laser–Recrystallized Silicon on Fused Quartz", *Applied Physics Letters,* vol. 44, No. 4, pp. 420–422, Feb. 1, 1984, New York, USA.

T. Kamins, Polycrystalline Silicon for Integrated Circuit Applications.

Bonnel et al, "Polycrystalline Silicon Thin Films Trasistors With Two–Step Annealing Process" IEEE Electrical Device Letters, vol. 16, No. 12, Dec. 1993.

*Primary Examiner*—Savitri Mulpuri
*Attorney, Agent, or Firm*—Hill & Simpson

[57] ABSTRACT

Method of forming a high-quality polycrystalline semiconductor thin film having large grain sizes by laser annealing. First, a film formation step is carried out to grow a semiconductor layer on an insulating substrate under certain film formation conditions, thus forming a precursory film. This precursory film comprises clusters of microscopic crystal grains. Then, an irradiation step is carried out. That is, the precursory film is irradiated with a laser beam such as an excimer laser pulse. The crystal sizes are increased to change the precursory film into a polycrystalline semiconductor thin film. During the film formation step, a precursory film having a crystal grain size of more than 3 nm is formed at a temperature of 500 to 650° C., for example, by LPCVD or APCVD. Under these conditions, the resulting polycrystalline precursory film is substantially free from hydrogen. During the irradiation step, a single pulse of excimer laser radiation is emitted.

5 Claims, 7 Drawing Sheets

U.S. PATENT DOCUMENTS

| | | | |
|---|---|---|---|
| 4,448,632 | 6/1984 | Akasaka | 438/479 |
| 4,933,296 | 6/1990 | Parks et al. | 438/30 |
| 5,213,997 | 5/1993 | Ishihara et al. | 438/97 |
| 5,278,093 | 1/1996 | Yonehara | 438/679 |
| 5,290,712 | 3/1996 | Sato et al. | 638/487 |
| 5,365,875 | 11/1994 | Asai et al. . | |
| 5,372,836 | 12/1994 | Imahashi et al. | 438/30 |
| 5,403,762 | 4/1995 | Takemura | 438/166 |
| 5,413,958 | 5/1995 | Imahashi et al. . | |
| 5,459,092 | 10/1995 | Kawasaki et al. | 438/30 |
| 5,466,638 | 11/1995 | Eguchi | 638/487 |
| 5,471,330 | 11/1995 | Sarma | 438/30 |
| 5,529,951 | 6/1996 | Noguchi et al. | 438/487 |
| 5,550,066 | 8/1996 | Tang et al. | 438/29 |
| 5,561,081 | 10/1996 | Takenouchi et al. . | |
| 5,591,668 | 1/1997 | Maegawa et al. . | |
| 5,605,866 | 2/1997 | Ohtani et al. | 438/487 |
| 5,610,736 | 3/1997 | Asai | 438/30 |
| 5,633,182 | 5/1997 | Miyawaki et al. | 438/30 |
| 5,712,191 | 1/1998 | Nakajima et al. . | |
| 5,756,364 | 5/1998 | Tanaka et al. . | |
| 5,804,471 | 9/1998 | Yamazaki et al. . | |

$d = \sqrt{a \times b}$

METHOD OF FORMING POLYCRYSTALLINE SEMICONDUCTOR THIN FILM

FIELD OF THE INVENTION

The present invention relates to a method of forming a polycrystalline semiconductor thin film. More particularly, the invention relates to techniques for increasing the grain size of a polycrystalline semiconductor thin film by irradiating it with an energy beam. The invention also relates to a method of fabricating a semiconductor device in which TFTs (thin-film transistors) are formed at a high density using a polycrystalline semiconductor thin film as an active layer. Furthermore, the invention relates to a method of fabricating an active matrix liquid crystal display incorporating semiconductor devices as an active matrix array substrate.

BACKGROUND OF THE INVENTION

The TFT semiconductor device has used a heatproof insulating substrate made of quartz or the like. TFTs have been fabricated at a high density by performing a high-temperature process above 1000° C. Such TFT semiconductor devices have been earnestly developed, for example, as active matrix array substrates for active matrix liquid crystal displays. To realize wider application of liquid crystal displays, there is a demand for reductions in the cost of fabricating TFT semiconductor devices. Low-temperature processes with which cheap glass substrates can be used have been discussed. Especially, in order to fabricate a large-sized, high-information content liquid crystal display, low-temperature processes capable of utilizing cheap glass substrates have been earnestly developed. In this connection, a technique consisting of forming a film of amorphous silicon on a low-melting point glass substrate and irradiating the film with a laser beam to convert the film into high-quality polysilicon has been studied. Since polysilicon has a larger carrier mobility than that of amorphous silicon, high-performance TFTs can be formed at a high density.

However, where amorphous silicon is used as a precursory film of clusters, even if the silicon is irradiated with a laser beam, it is impossible to obtain sufficiently large grain size. Rather, only crystallites are obtained. With silicon thin films in the state of crystallites, it is difficult to obtain TFTs of high performance. However, if the energy of the irradiating laser beam is optimized to some extent, it is possible to convert amorphous silicon into polysilicon. Also in this case, the range of the irradiating energy enabling satisfactory grain sizes is very narrow and so it is difficult to stably mass-produce high-quality polysilicon thin films in practice. It is common practice to form amorphous silicon thin films by plasma-assisted CVD. However, the films contain a large amount of hydrogen. For this reason, the contained hydrogen is caused to bump by the laser irradiation, and other problems occur. These make it difficult to put this technique into practical use.

SUMMARY OF THE INVENTION

In view of the foregoing problems with the prior art techniques, it is an object of the present invention to provide high-quality polycrystalline semiconductor thin films.

To achieve this object, the following means are used. That is, according to the present invention, a polycrystalline semiconductor thin film is formed by the following steps. First, a film formation step is performed to grow a semiconductor layer on an insulating substrate to form a precursory film of polycrystalline comprising clusters of microscopic crystal grains. Then, an irradiation step is carried out. That is, the precursory film is irradiated with an energy beam to increase the grain sizes of the crystal grains. As a result, the precursory film is converted into a polycrystalline semiconductor thin film. More specifically, a precursory film having crystal grains of more than 3 nm in grain diameter is formed by LPCVD or atmospheric-pressure CVD at a film formation temperature of 500 to 650° C. In this film formation step, the polycrystalline precursory film can be formed under film formation conditions which substantially preclude inclusion of hydrogen. In the above-described irradiation step, an energy beam consisting, for example, of an excimer laser pulse is shot once.

The method of the invention of forming a polycrystalline semiconductor thin film is applicable to a method of fabricating TFT semiconductor devices. This fabrication method is initiated with a film formation step. A semiconductor is grown under certain film formation conditions on an insulating substrate to form a polycrystalline precursory film comprising clusters of microscopic crystal grains. Then, an irradiation step is carried out. That is, the precursory film is irradiated with an energy beam to increase the grain sizes of the crystal grains. In consequence, the precursory film is converted into a polycrystalline semiconductor thin film. Finally, a working step is carried out. Using the polycrystalline semiconductor thin film as an active layer, TFTs are formed at a high density, thus completing TFT semiconductor devices.

The aforementioned method of fabricating the TFT semiconductor devices can be especially preferably applied to manufacture of active matrix liquid crystal displays. This fabrication method is started with a film formation step. A semiconductor layer is grown on an insulating substrate under certain film formation conditions to form a polycrystalline precursory film comprising clusters of microscopic crystal grains. Then, an irradiation step is carried out. That is, the precursory film is irradiated with an energy beam to increase the grain sizes of the crystal grains. In consequence, the precursory film is converted into a polycrystalline semiconductor thin film. Thereafter, a first working step is performed to form TFTs at a high density, using the polycrystalline semiconductor thin film as an active layer. Subsequently, a second working step is carried out to form pixel electrodes at a high density and to connect them with their respective TFTs. Finally, an assembly step is performed. That is, a counter substrate having a counter electrode previously formed thereon is bonded to the insulating substrate via a gap. Then, a liquid crystal material is injected into the gap, thus completing an active matrix liquid crystal display.

According to the present invention, a precursory cluster film consisting, for example, of polycrystalline silicon is first formed on an insulating substrate by low-pressure chemical vapor deposition (LPCVD) or atmospheric-pressure chemical vapor deposition (APCVD). This cluster film is irradiated with an energy beam such as a laser beam to crystallize the film. At this time, the polysilicon formed as a film by LPCVD or APCVD is substantially free from hydrogen. Since the hydrogen content of the precursory cluster film is low, it is easy to increase the grain sizes. By these methods, the thin-film semiconductor formed on the insulating substrate can be converted into a high-quality polycrystalline semiconductor having large grain sizes by the use of the energy beam.

Other objects and features of the invention will appear in the course of the description thereof, which follows.

DETAILED DESCRIPTION OF THE PREFERRED EMBODIMENTS

Preferred embodiments of the present invention are hereinafter described in detail with reference to the accompanying drawings.

Figure 1A:
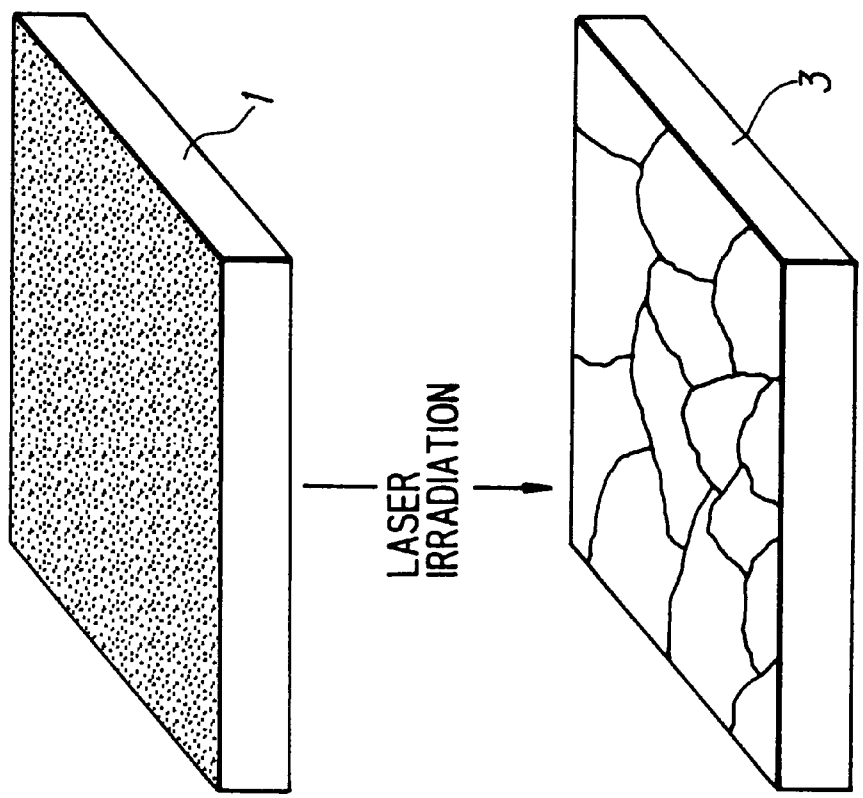
FIG. 1(A) is a view illustrating a method of forming a polycrystalline semiconductor thin film according to the present invention.
Figure 1B:
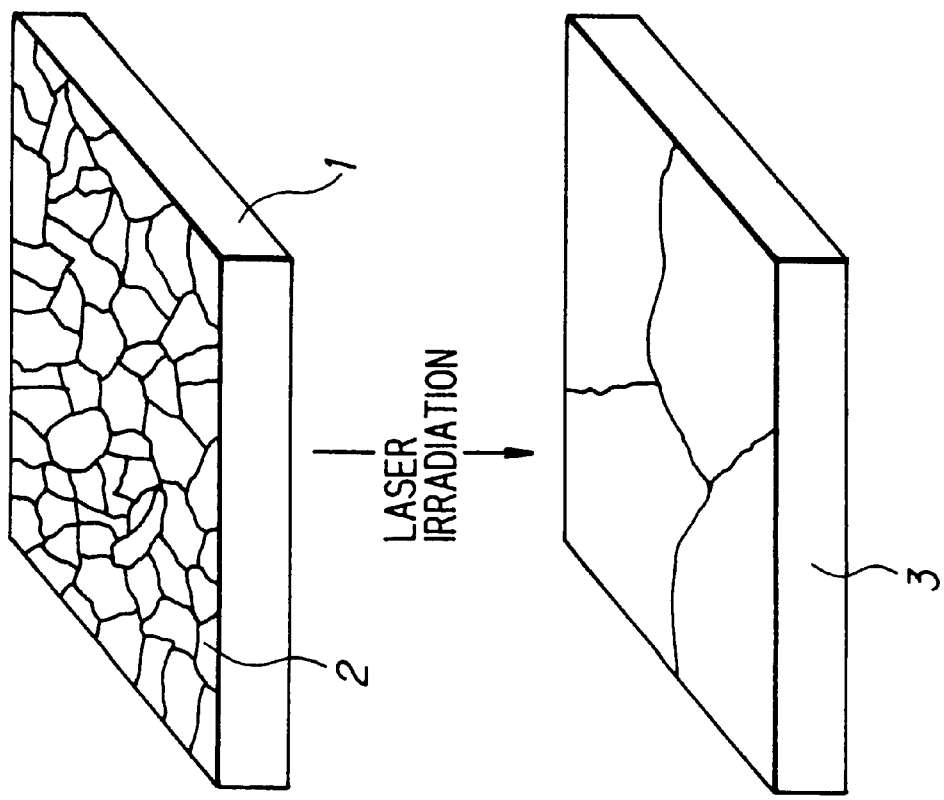
FIG. 1(B) is a view illustrating a prior art method of forming a polycrystalline semiconductor thin film.

FIG. 1(A) is a view illustrating a novel method of forming a polycrystalline semiconductor thin film. FIG. 1(B) illustrates a prior art method of forming a polycrystalline semiconductor thin film, for comparison purposes. According to the invention, as shown in FIG. 1(A), a film formation step is first carried out to grow a semiconductor layer on an insulating substrate (not shown) under certain film formation conditions so as to form a precursory film 1. This precursory film 1 consists of clusters of microscopic crystal grains 2 and is polycrystalline. Then, an irradiation step is performed. An energy beam such as a laser beam is directed at the film. The film is subjected to thermal hysteresis. The grain sizes are increased to convert the precursory film into a thin film 3 of polycrystalline semiconductor. Specifically, polysilicon having grain sizes of more than 3 nm is formed as the precursory film 1 on the insulating substrate at a film formation temperature of 500 to 650° C. by LPCVD, APCVD, or another method. Where this film formation method is applied to the manufacture of an active matrix liquid crystal display, the insulating substrate is made of a transparent material such as glass. Preferably, the crystal grains 2 contained in the polysilicon have grain sizes of at least about 3 nm. If the grain sizes are less than this value, the state is close to an amorphous state rather than a polycrystalline state. Preferably, polysilicon having grain sizes of 30 to 50 nm is formed as a film by LPCVD or another method. In LPCVD, 100% $SiH_4$, for example, is used as a gaseous raw material. The polysilicon is grown by CVD, using the direct decomposition of this silane. Desired grain sizes can be accomplished at a film formation temperature of about 500 to 600° C. Glass material or the like which can withstand this film formation temperature may be used as the material of the insulating substrate. Since the film is formed by making use of direct decomposition of silane, the polysilicon is substantially free from hydrogen. If a trace amount of hydrogen is contained, it is released during the film formation step, because the film formation temperature is higher than 400° C. In the next irradiation step, the film is irradiated, for example, with excimer laser radiation having a wavelength of 308 nm, an energy density of 150 to 450 $mJ/cm^2$, and a pulse duration time of about 10 to 1000 ns such that a substrate temperature of about 20 to 450° C. is obtained. The polysilicon is once melted by single-shot irradiation with an excimer laser pulse and then recrystallizes. The crystal grains increase in size because of this thermal hysteresis.

On the other hand, in the reference example shown in FIG. 1(B), amorphous silicon is formed as a film by plasma-assisted chemical vapor deposition (PCVD). This film is used as a precursory film 1. In the PCVD, a mixture gas of silane and hydrogen is used as a gaseous raw material, and amorphous silicon is grown by plasma decomposition. The substrate temperature is about 180 to 350° C. Because the gaseous raw material contains a large amount of hydrogen, and because the film formation temperature is below 450° C., the amorphous silicon contains, for example, approximately 15–20% hydrogen. If this precursory film 1 consisting of the amorphous silicon is irradiated with laser radiation, a polycrystalline semiconductor thin film 3 is obtained.

Crystallization of both polysilicon and amorphous silicon is made to progress by performing laser annealing as described above. As shown in FIG. 1(A), where polysilicon is used as the precursory film, the grain sizes of the crystal grains 2 not yet having undergone laser irradiation have been increased greatly by the laser irradiation. For instance, the grain sizes obtained after the laser irradiation reach 500 nm, for example. On the other hand, as shown in FIG. 1(B), where the amorphous silicon is used as the precursory film 1, the laser irradiation may result in a semiconductor thin film 3 but the crystal grain sizes are smaller than the sizes obtained where polysilicon is used as the precursory film.

Figure 2:
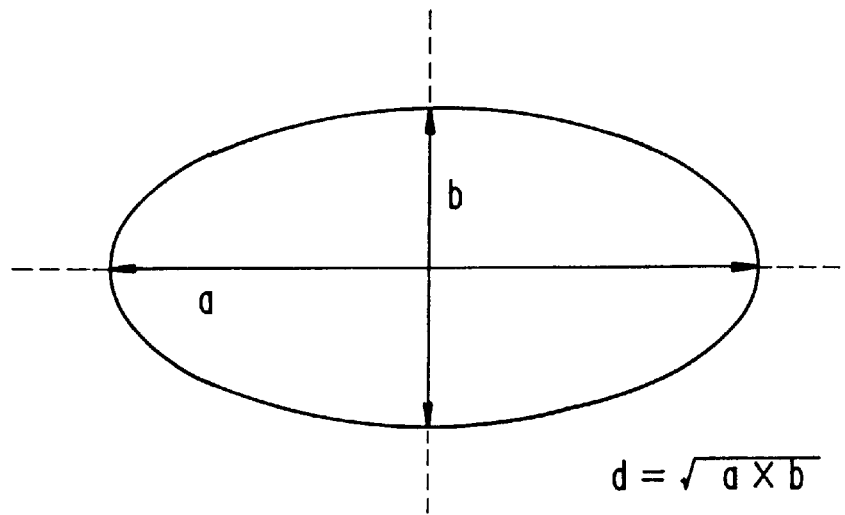
FIG. 2 is a schematic diagram illustrating a method of calculating crystal grain diameters.

Table 1 below shows the relation between the average crystal grain size of the polycrystalline semiconductor thin film obtained in this way and the energy density. For comparison, results obtained by laser annealing amorphous silicon similarly are also shown. The data on the crystal grain sizes listed in Table 1 was calculated by the method illustrated in FIG. 2. In particular, crystal grain sizes were found by actually measuring the longer diameter a and the shorter diameter b of each individual crystal grain by transmission electron microscopy (TEM) and calculating the square root of the product of both diameters. As can be seen from the results of measurements listed in Table 1, where the amorphous silicon is used as the precursory film, the average crystal grain diameters depend heavily on the energy density. The range of conditions providing large grain sizes is narrow. On the other hand, where polysilicon is used as the precursory film, the hydrogen content of the film is lower than the content in the case of the amorphous silicon. Therefore, the average crystal grain diameters obtained after the laser irradiation depend to a lesser extent on the energy. Large grain sizes can be obtained over a wide range of energies. Furthermore, the crystal grain sizes are larger than the sizes obtained where amorphous silicon is employed. Large grain sizes amounting to 500 nm are obtained.

TABLE 1

| energy density (mJ/cm$^2$) | amorphous silicon (nm) | polysilicon (nm) |
|---|---|---|
| 100–200 | 72 | 467 |
| 200–300 | 308 | 523 |
| 300–400 | 34 | 486 |

Figure 3:
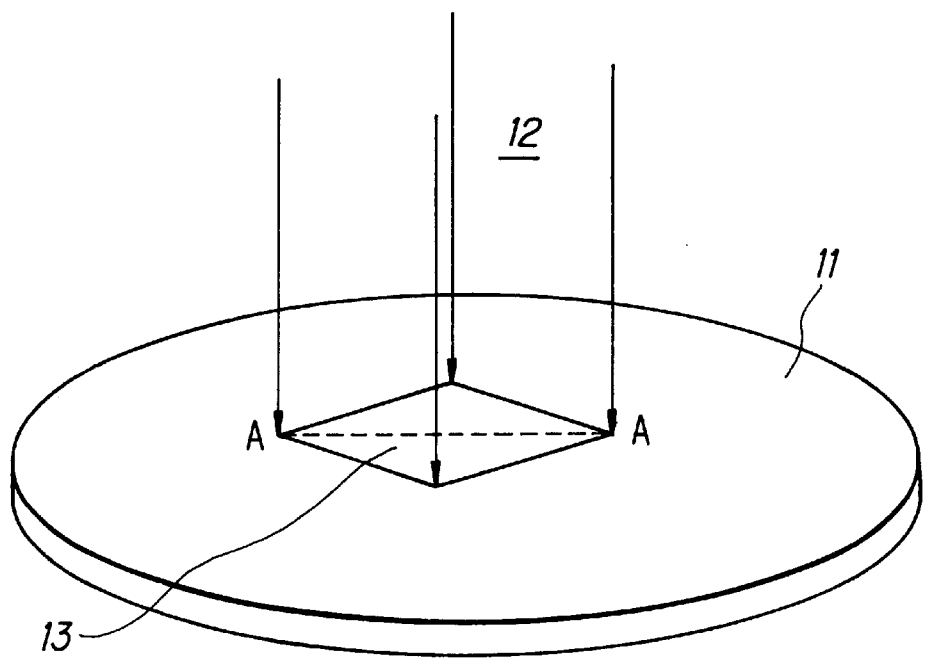
FIG. 3 is a diagram illustrating one example of a laser irradiation step.

FIG. 3 shows a specific example of laser irradiation shown in FIGS. 1(A) and 1(B). In this example, an insulating substrate 11 consisting of a large wafer is irradiated with a single shot of laser pulse 12. This irradiated region is a square area region 13, for example, of 5×5 cm$^2$. The wafer is partitioned into such area regions 13, thus obtaining desired thin-film semiconductor devices. That is, each area region 13 corresponds to one chip. Of course, before the laser irradiation, a precursory film consisting, for example, of polysilicon is formed on the surface of the insulating substrate 11.

Figure 4:
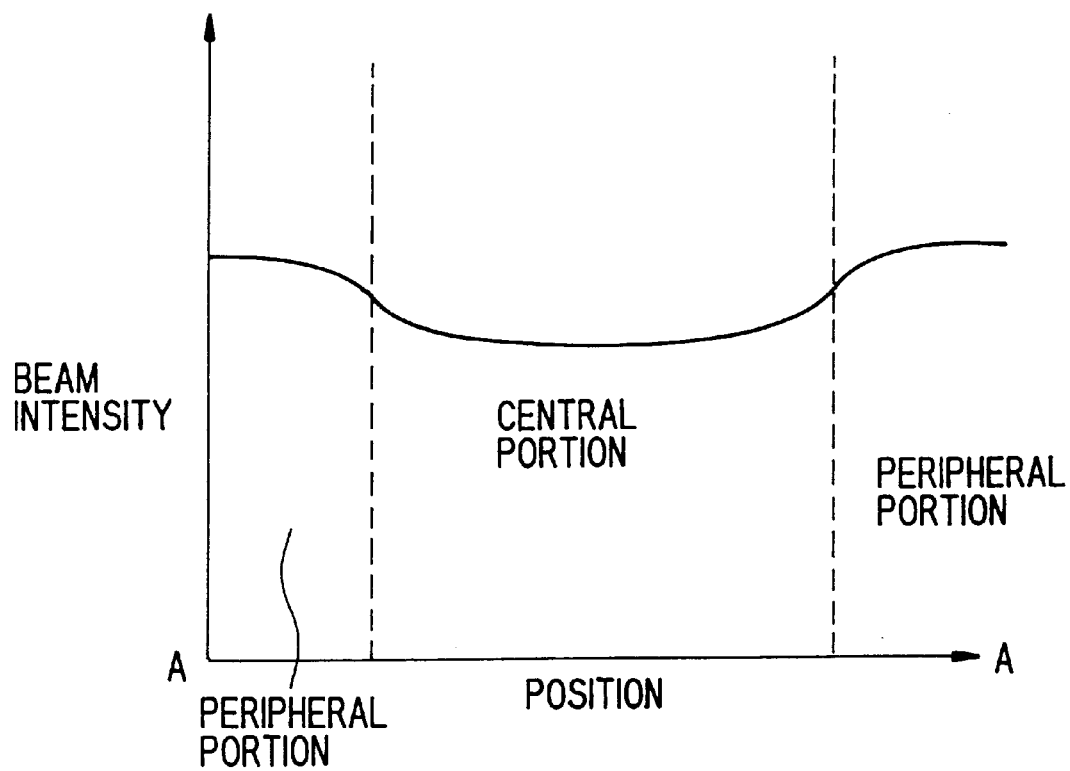
FIG. 4 is a graph showing a cross-sectional intensity distribution of laser radiation.

The distribution of cross-sectional intensities of the laser pulse 12 along the diagonal line A—A across the area region 13 is represented by the graph of FIG. 4. As shown, the laser beam intensity is so set that it is lower at the center of the area region and higher in the peripheral regions. More specifically, the laser beam intensity in the peripheral regions is set higher than that at the center by about 1 to 70%. The graph of FIG. 4 shows the distribution of the cross-sectional intensities along the diagonal line A—A shown in FIG. 3. Similar intensity distribution is observed in other orientations. Thus, it follows that the shape obtained by rotating the profile shown in FIG. 4 about a normal line passing through the midpoint of the diagonal line A—A shows a three-dimensional energy distribution of the laser pulse. By establishing the energy distribution in this way, temperature drop due to heat dissipation from the peripheral portions can be prevented. Hence, a uniform crystal grain diameter can be obtained over the whole area region irradiated with the laser radiation. This cross-sectional intensity distribution of the laser pulse can be obtained by increasing the relative beam intensity in the peripheral regions with a simple optical system and reducing the relative beam intensity at the center.

Figure 5:
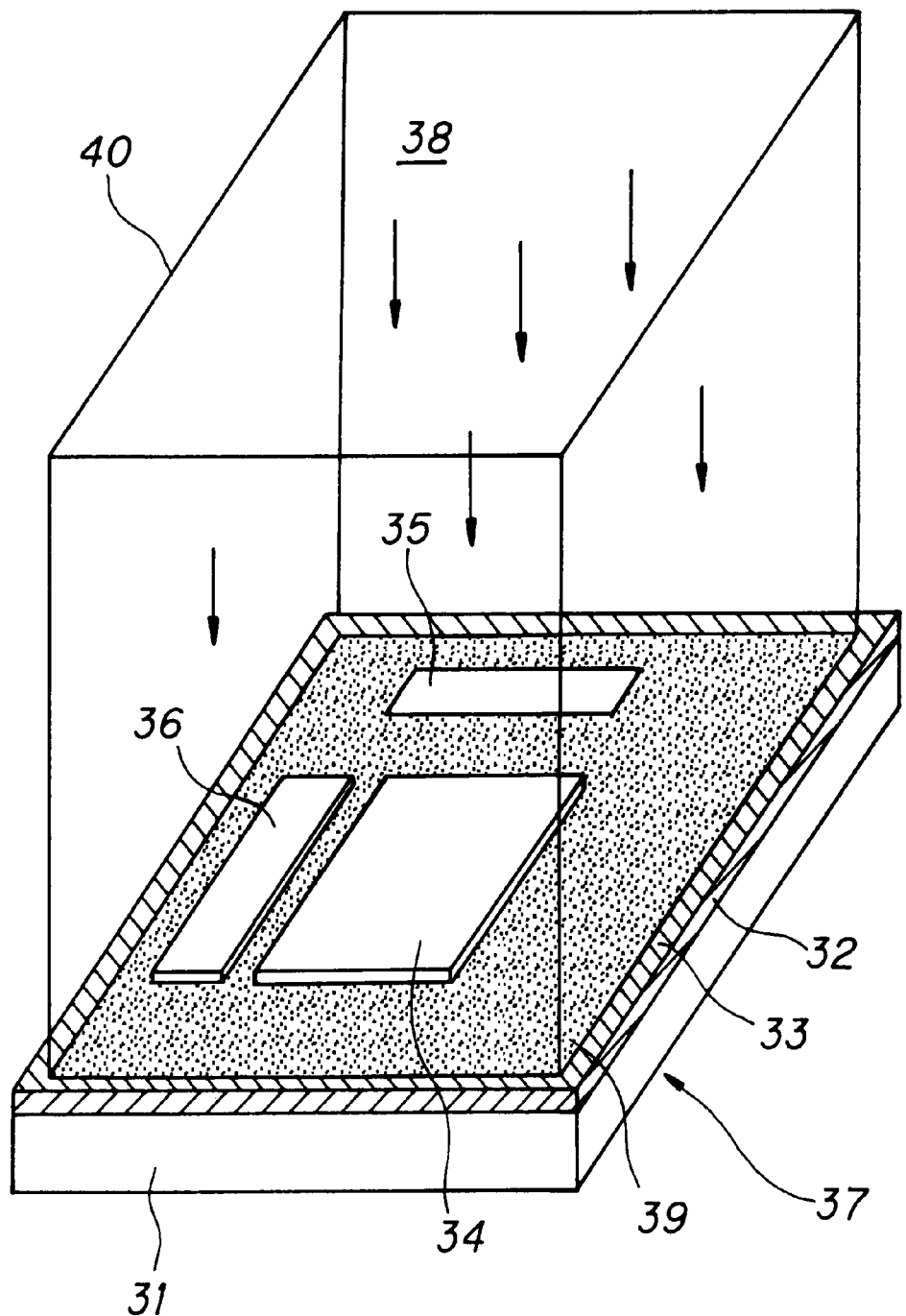
FIG. 5 is a schematic perspective view of one example of a TFT semiconductor device for a display device, the TFT semiconductor device being fabricated according to the invention.
Figure 6A:
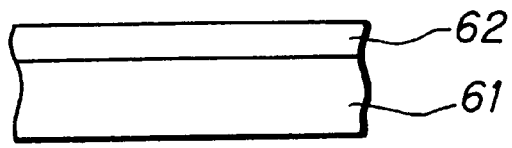
FIGS. 6(A)–6(D) are schematic cross sections illustrating the process sequence of a method of fabricating a TFT semiconductor device according to the invention.
Figure 6B:
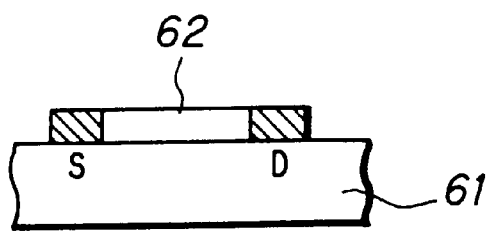
Figure 6C:
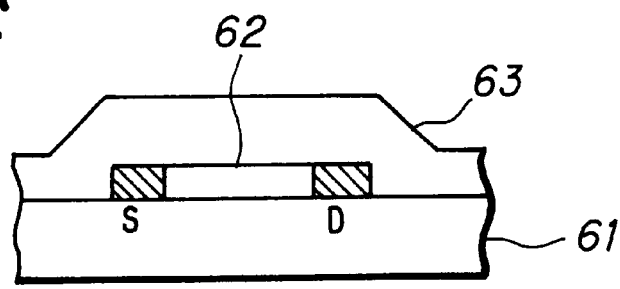
Figure 6D:
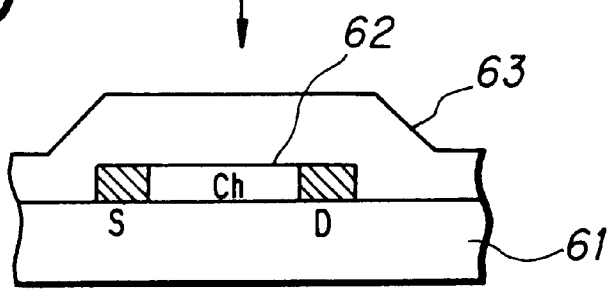

FIG. 5 illustrates one example of application of the present invention, i.e., a method of fabricating a TFT semiconductor device used as a display device. In this fabrication method, a film formation step is first carried out. That is, a semiconductor thin film 32 is formed on a transparent insulating substrate 31 made of a glass material. This semiconductor thin film 32 is polycrystalline and has relatively small grain sizes in a clustered state. For example, the thin film consists of polysilicon. Then, a series of processes including laser annealing of the semiconductor thin film 32 is performed. TFTs are formed at a high density on the area region 33 corresponding to one chip. In the present example, a matrix array 34, a horizontal scanning circuit 35, and a vertical scanning circuit 36 are included within the area region 33. In any of these components, TFTs are formed at a high density. Finally, pixel electrodes for one frame of image are formed on the matrix array 34, thus completing the TFT semiconductor device for a display device.

The fabrication method described above includes a laser irradiation step. The area region 33 is irradiated with single shot of laser pulse 38. The semiconductor film 32 for one chip is heat-treated in a batch. This laser irradiation step is intended to crystallize the semiconductor thin film 32 by the batch heat treatment. The present invention is characterized in that the semiconductor thin film 32 is polycrystalline and has relatively small grain sizes in a clustered state. The film is melted by the batch heat treatment. Then, they are recrystallized. As a result, the small grains can be converted into polycrystals having relatively large grain sizes. Excimer laser light can be used as the laser pulse 38. Since the excimer laser light is intense pulsed UV light, it is absorbed by the surface layer of the semiconductor thin film 32 which is made of silicon or the like to thereby elevate the temperature in this portion. However, it is unlikely that even the insulating substrate 31 is heated. Where a silicon film having a thickness, for example, of 30 nm is formed on the transparent insulating substrate 31 consisting of glass material by LPCVD, the threshold energy for melting when XeCl excimer laser light is emitted is about 130 mJ/cm$^2$. An energy of about 220 mJ/cm$^2$, for example, is needed to melt the whole film thickness. The time taken for the film to resolidify after melting is about 70 ns.

Generally, the insulating substrate 31 consists of a large-sized wafer from which a number of TFT semiconductor devices 37 for display devices can be taken. That is, a plurality of area regions 33 have been previously established on the wafer. In the laser irradiation step, each area region is successively irradiated with a single shot of laser pulse 38. In this case, each area region 33, excluding a separator 39, is shot with a single pulse 38 of the laser radiation, the separator 39 being formed between adjacent area regions 33. In the present example, each area region 33 is rectangular in shape. A single pulse 38 of the laser radiation having a rectangular cross section 40 conforming to the rectangular region 33 is directed at the region 33.

A method of fabricating the TFT semiconductor devices shown in FIG. 5 is will now be described in detail for reference by referring to FIGS. 6 and 7, the TFT semiconductor devices being used for display devices. First, a transparent insulating substrate 61 is prepared in the step illustrated in FIG. 6(A). This transparent insulating substrate 61 is made from glass material, for example, whose maximum processing temperature is slightly in excess of 600° C. A semiconductor thin film 62 serving as an active layer of TFTs is formed on this transparent insulating substrate 61. Polysilicons having very small grain sizes are formed as a thin film by LPCVD, for example. Then, in the step illustrated in FIG. 6(B), the semiconductor thin film 62 is patterned into a desired shape acting as device regions of the TFTs. Impurities are introduced into the device regions, for example by ion implantation or some other method. In this way, source regions S and drain regions D are formed. Subsequently, in the step illustrated in FIG. 6(C), an antireflective film 63 is formed prior to laser processing to enhance the efficiency of the laser processing. This antireflective film consists, for example, of SiO$_2$, and is deposited to a thickness of 30 to 100 nm. It is necessary that this antireflective film 63 be formed below the maximum processing temperature of the transparent insulating substrate 61. Thereafter, the step illustrated in FIG. 6(D), a laser pulse is directed to the regions via the antireflective film 63. The energy is about 150 to 500 mJ/cm$^2$. The pulse width is set above 40 nm. This laser irradiation crystallizes those portions of the semiconductor thin film 62 which will become channel regions Ch. Also, the impurities injected in the source regions S and the drain regions D are activated. Single-shot irradiation of the laser pulse can crystallize the silicon film below the maximum processing temperature of the transparent insulating substrate 61 and activate the impurities.

Figure 7E:
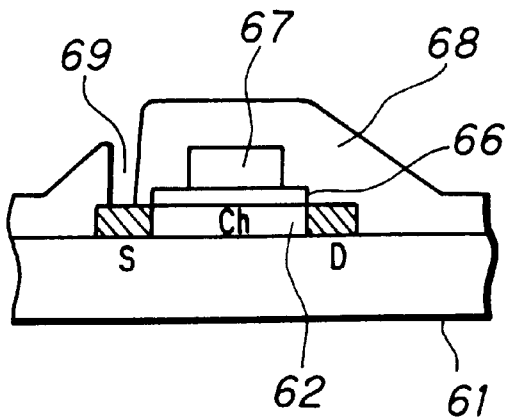
FIGS. 7(E)–7(G) are views illustrating the process sequence of the method of fabricating a TFT semiconductor device according to the invention.
Figure 7F:
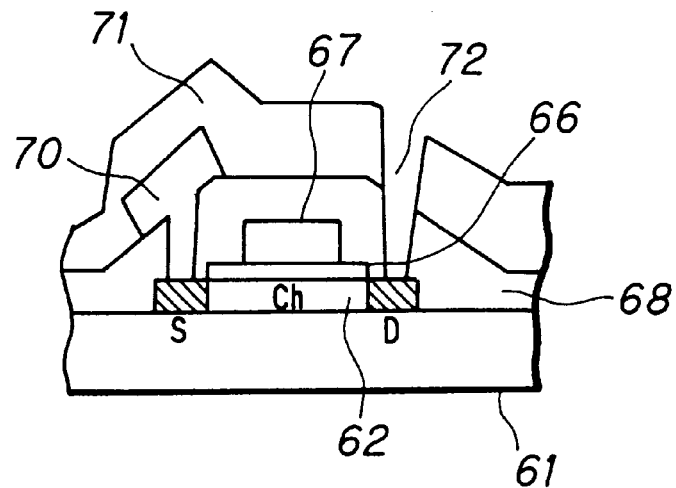
Figure 7G:
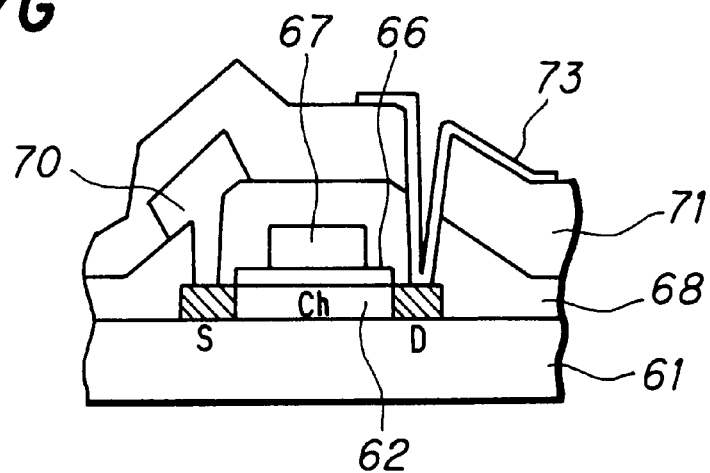

The processing then proceeds to the step illustrated in FIG. 7(E). The antireflective film 63 which is made unnecessary after the laser irradiation is peeled off. Then, a gate-insulating film 66 is formed on the channel regions Ch. This gate-insulating film 66 is made of $SiO_2$, P-SiN, or other material and has a thickness of 150 nm, for example. Gate electrodes 67 are formed on the gate-insulating film 66. In this example, the gate electrodes are made of aluminum to permit processing below 600° C. A first interlayer dielectric film 68 made from PSG is formed to a thickness of 500 nm. Contact holes 69 which are in communication with the source regions S are formed in the first interlayer dielectric film 68. In the next step illustrated in FIG. 7(F), conductive interconnects 70 which are connected with the source regions S are formed by patterning techniques. PSG is deposited to a thickness of 500 nm as a second interlayer dielectric film 71. Contact holes 72 which are in communication with the drain regions D via the second interlayer dielectric film 71 and via the first interlayer dielectric film 68 are formed. Finally, in the step illustrated in FIG. 7(G), ITO is deposited as a film on the second interlayer dielectric film 71 and patterned into a desired shape to create pixel electrodes 73. In this way, TFTs for activating pixel electrodes contained in the matrix array of the TFT devices for display devices are completed.

Figure 8:
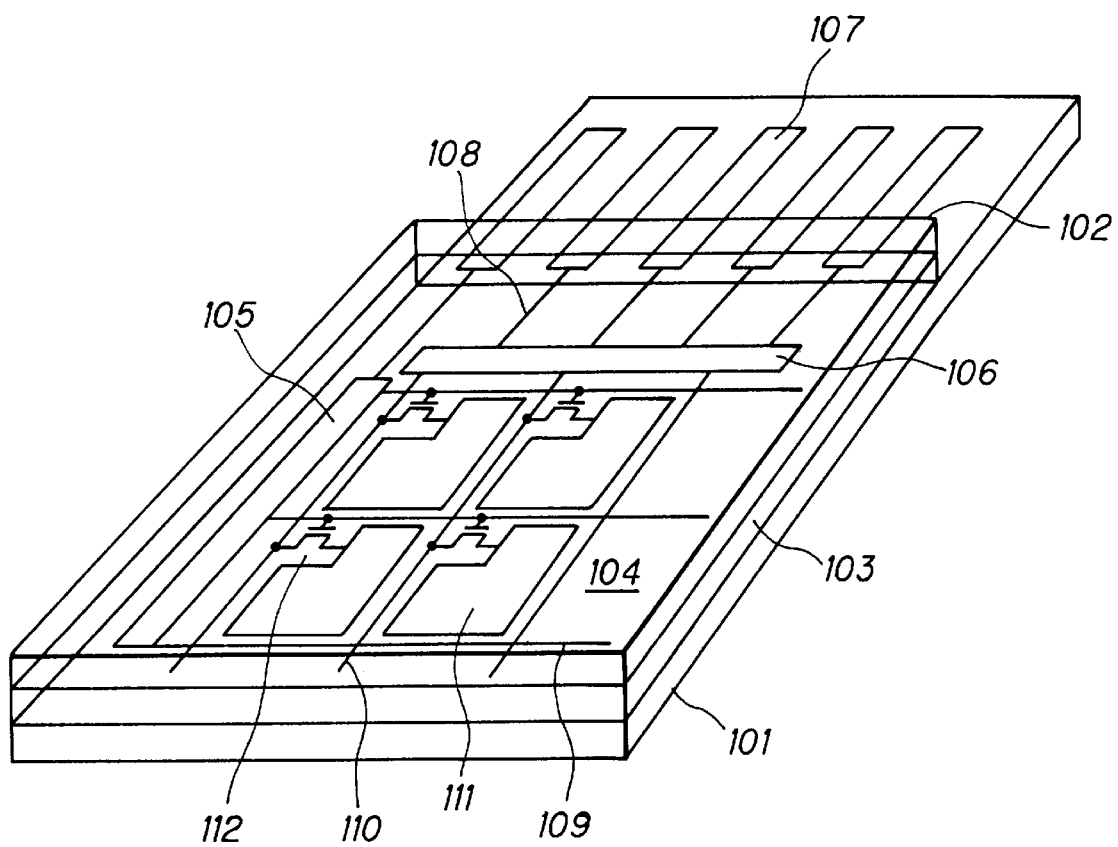
FIG. 8 is a schematic perspective view of an active matrix liquid crystal display fabricated according to the invention.

Finally, FIG. 8 is a perspective view showing one example of an active matrix liquid crystal display assembled, using the TFT semiconductor device for a display device as an active matrix array substrate, the TFT semiconductor device being shown in FIG. 5. As shown, the present liquid crystal display has a panel structure comprising the active matrix array substrate 101, a counter substrate 102, and a liquid crystal material 103 held between both substrates. A pixel array 104 and a driver circuit portion are integrally formed on the active matrix array substrate 101. The driver circuit portion is divided into a vertical scanning circuit 105 and a horizontal scanning circuit 106. A terminal portion 107 for external connection is formed at the top end of the peripheral portion of the active matrix array substrate 101. The terminal portion 107 is connected with the vertical scanning circuit 105 and with the horizontal scanning circuit 106 via interconnects 108. The matrix array 104 includes gate lines 109 and signal lines 110 which are arranged so as to be perpendicular to each other. Pixel electrodes 111 and TFTs 112 for activating the pixel electrodes are provided at the intersections of the lines 109 and 110. The source electrodes of the individual TFTs 112 are connected with their respective signal lines 110. The gate electrodes are connected with their respective gate lines 109. The drain electrodes are connected with their respective pixel electrodes 111. The gate lines 109 are connected to the vertical scanning circuit 105, while the signal lines 110 are connected to the horizontal scanning circuit 106.

As described above, according to the present invention, in large-area batch laser annealing processing, a polycrystalline semiconductor thin film having crystal grains which are uniform over a wide range of energies and have large grain sizes can be obtained. Consequently, TFTs using this thin film as their active layer can be designed so that they have uniform characteristics and high mobilities. Hence, when large-area, high-information content active matrix liquid crystal displays are realized in the future, the present invention will produce great advantages.

What is claimed is:

1. A method of making a thin film semiconductor device, comprising the steps of:

providing an insulating substrate comprising a glass material having a maximum processing temperature of a 600° C. having a surface;

growing a precursory polycrystalline semiconductor layer substantially free of hydrogen and comprising clusters of microscopic polycrystalline silicon crystal grains having a grain diameter of greater than 3 nm on the surface by low pressure or atmospheric pressure chemical vapor deposition at a temperature of from about 500 to 600° C. using 100% $SiH_4$ as a gaseous raw material;

implanting impurities into device regions of the precursory polycrystalline semiconductor layer to form source and drain regions in each said device regions;

forming an anti-reflective film on the implanted precursory polycrystalline semiconductor layer at a temperature below the maximum processing temperature of the insulating substrate;

irradiating the precursory polycrystalline semiconductor layer in a single shot with an excimer pulse laser having a rectangular shaped beam having a cross-sectional intensity distribution such that beam intensity in peripheral regions of the beam is higher than beam intensity in a central region of the beam by about 1 to about 70% and having an energy density of from about 150 to about 500 $mJ/cm^2$ and a pulse duration time of from about 10 to about 1000 nanoseconds such that a substrate temperature of from about 20 to about 450° C. is maintained to recrystallize the precursory layer to provide a polycrystalline semiconductor thin film having a crystal grain size of great than or equal to about 467 nm and to activate implanted impurities;

removing the anti-reflective film;

forming a gate insulating film in each device region in a channel region defined between source and drain regions; and thereafter, forming an aluminum gate electrode on the gate insulating film to provide said thin film semiconductor device.

2. A method as defined in claim 1, wherein each of the steps is performed so that processing temperatures are maintained below about 600° C.

3. A method as defined in claim 1, wherein in said irradiating said rectangular shaped beam illuminates a square area region of about 5 cm×5 cm.

4. A method for making a liquid crystal display comprising the steps of;

providing an insulating substrate comprising a glass material having a maximum processing temperature of about 600° C. having a surface;

growing a precursory polycrystalline semiconductor layer substantially free of hydrogen and comprising clusters of microscopic polycrystalline silicon crystal grains having a grain diameter of greater than 3 nm on the surface by low pressure or atmospheric pressure chemical vapor deposition at a temperature of from about 500 to 600° C. using 100% $SiH_4$ as a gaseous raw material;

implanting impurities into device regions of the precursory polycrystalline semiconductor layer to form source and drain regions in each said device regions;

forming an anti-reflective film on the implanted precursory polycrystalline semiconductor layer at a temperature below the maximum processing temperature of the insulating substrate;

irradiating the precursory polycrystalline semiconductor layer in a single shot with an excimer pulse laser having a rectangular shaped beam having a cross-section intensity distribution such that beam intensity in peripheral regions of the beam is higher than beamintensity in a central region of the beam by about 1 to about 70% are having an energy density of from about 150 to about 500 mJ/cm$^2$ and a pulse duration time of from about 10 to about 1000 nanoseconds such that a substrate temperature of from about 20 to about 450° C. is maintained to recrystallize the precursory layer to provide a polycrystalline semiconductor thin film having a crystal grain size of greater than or equal to about 467 nm and to activate implanted impurities;

removing the anti-reflective film;

forming a gate insulating film in each device region in a channel region defined between source and drain regions; and forming an aluminum gate electrode on the gate insulating film to provide a thin film semiconductor device in each device region;

forming pixel electrodes connected to each said thin film semiconductor device;

bonding a counter substrate having a counter electrode formed thereon adjacent the surface of said insulating substrate to define a gap there between; and thereafter injecting a liquid crystal material into said gap to provide said liquid crystal display.

5. A method as defined in claim 4, wherein in said irradiating step, said rectangular shaped beam illuminates a square area region of about 5 cm×5 cm.

* * * * *